United States Patent [19]
Jensen

[11] Patent Number: 6,075,995
[45] Date of Patent: Jun. 13, 2000

[54] AMPLIFIER MODULE WITH TWO POWER AMPLIFIERS FOR DUAL BAND CELLULAR PHONES

[75] Inventor: Niels J. Jensen, Niguel, Calif.

[73] Assignee: Conexant Systems, Inc., Newport Beach, Calif.

[21] Appl. No.: 09/016,242

[22] Filed: Jan. 30, 1998

[51] Int. Cl.[7] .............................. H04B 1/38; H04B 1/06; H01L 23/34; H05K 7/20
[52] U.S. Cl. ........................ 455/550; 257/723; 257/724; 257/728; 361/719; 455/253.2
[58] Field of Search ............................ 455/550, 90, 575, 455/73, 84, 252.1, 232.1, 253.2; 257/777, 723, 724, 728, 698; 361/783, 719, 720, 717, 718; 438/107–109

[56] References Cited

U.S. PATENT DOCUMENTS

| | | | |
|---|---|---|---|
| 5,541,554 | 7/1996 | Stengel et al. | 330/51 |
| 5,774,017 | 6/1998 | Adar | 330/51 |
| 5,796,165 | 8/1998 | Yoshikawa et al. | 257/728 |

FOREIGN PATENT DOCUMENTS

| | | |
|---|---|---|
| 0 744 931 A2 | 11/1996 | European Pat. Off. . |
| 44 44 680 A1 | 6/1996 | Germany . |

OTHER PUBLICATIONS

"RF Chip Set Provides Multiband Cellular/PCS Solutions"; Jan., 1997; Wireless Systems Design; p. 62.

"RFICs: Dual Band Cell Phones Emerge"; Lawrence J. Curran; May 22, 1997; EDN; pp. 21–24.

"Dual Mode Will Explode"; Bill Menezes; Study; Jun. 30, 1997; Wireless Week.

Product description—Track to Multi–band GSM; Symbionics, Ltd. No date on brochure.

PCT International Search Report.

Parkhurst, Ray et al., "Silicon Bipolar 3V Power Amplifier for GSM 900/GSM1800 Handsets," *IEEE*, 1998, pp. 117–119.

Furst, Robert, "With GaAs MMICs Towards Dual Band Front End Applications in Wireless Communication", 27th European Microwave 97 Conference, vol. 8, Sep. 8–12, 1997, pp. 1289–1294.

*Primary Examiner*—Dwayne D. Bost
*Assistant Examiner*—Tracy M. Legree
*Attorney, Agent, or Firm*—Knobbe, Martens, Olson & Bear LLP

[57] ABSTRACT

Disclosed is an amplifier module suitable for automated mounting and connecting to a motherboard of a cellular phone. The amplifier module comprises a substrate which has at least two layers of electrically conducting material. On the substrate, a first and second semiconductor chip are mounted. The first semiconductor chip includes a first integrated circuit which forms part of a first power amplifier adapted for a first radio frequency band. The second semiconductor chip includes a second integrated circuit which forms part of a second power amplifier adapted for a second radio frequency band. The first and second chips are positioned on the substrate and electrically connected to components mounted on the substrate.

21 Claims, 15 Drawing Sheets

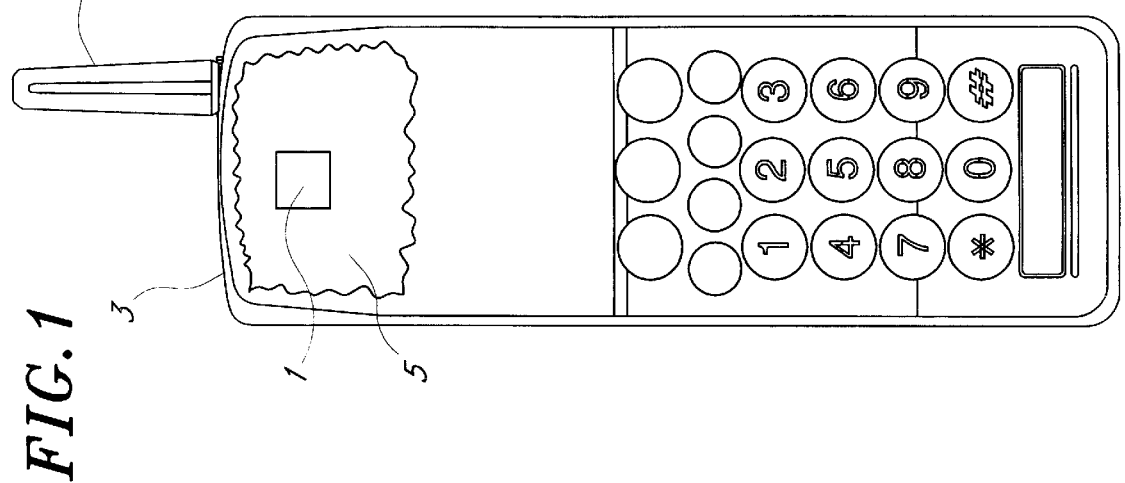
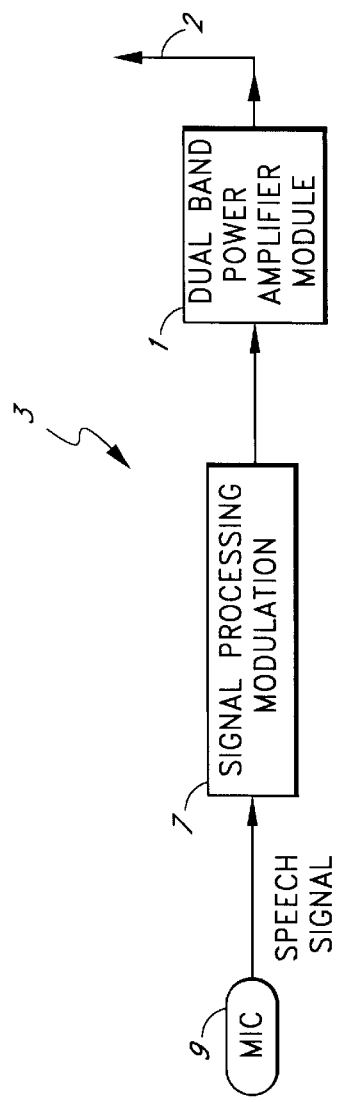

AMPLIFIER MODULE WITH TWO POWER AMPLIFIERS FOR DUAL BAND CELLULAR PHONES

BACKGROUND OF THE INVENTION

The invention relates to cellular phones used in mobile communications systems. More particularly, the invention relates to amplifiers for use in dual band cellular phones.

Usually, cellular phones are designed to operate within the environment of only one of several mobile communications networks. One example of such an environment is a mobile communications network according to a standard known as GSM (Global System for Mobile communications) created by the European Telecommunications Standards Institute (ETSI). According to GSM, there is an assigned frequency band around 900 MHz for Standard GSM, and an assigned frequency band around 1800 MHz for Extended GSM. A GSM system operating in the 1800 MHz band is also referred to as DCS1800 (Digital Communications System, DCS) which can be considered to be a further mobile communications environment. Other environments include systems known as Advanced Mobile Phone System (AMPS) operating in a frequency band around 800 MHz, and as Personal Communications System (PCS) operating in a frequency band around 1900 MHz.

As the number of users of cellular phones increases, some operators have added capacity to their networks by including more than only one frequency band in their networks. In the case of the GSM system, for example, the frequency bands around 900 MHz and 1800 MHz are now used to expand the capacities of certain networks.

Manufacturers of cellular phones, therefore, are developing a new generation of cellular phones which are operable at two frequency bands. A cellular phone operable at two frequency bands is referred to as a dual band cellular phone. As the dual band cellular phone has to transmit signals at both frequency bands, duplication of some functions is required. Duplication of functions, however, leads to higher manufacturing costs and ultimately to higher prices for the dual band cellular phones.

SUMMARY OF THE INVENTION

There is therefore a need to keep the manufacturing costs caused by the duplication as low as possible. Further, there is a need to keep the size of dual band cellular phones small since users have come to expect single band cellular phones to be small and to have an attractive design.

In one aspect of the invention an amplifier module is provided which is suitable for automated mounting on a motherboard of a cellular phone. The amplifier module comprises a substrate having an upper surface, a lower surface, and at least two layers of electrically conducting material. The amplifier module further comprises a first and second semiconductor chip. The first semiconductor chip comprises a first integrated circuit which operates as part of a first power amplifier adapted for a first radio frequency band. The second semiconductor chip comprises a second integrated circuit which operates as part of a second power amplifier adapted for a second radio frequency band. The first and second semiconductor chips are positioned on said upper surface of said substrate and electrically connected to components mounted on said upper surface.

In a further aspect of the invention an amplifier module is provided which is suitable for automated positioning on a motherboard of a cellular phone, wherein the substrate having an upper surface and a lower surface and at least two layers of electrically conducting material, comprises thermal vias which extend from said upper surface to said lower surface. At least one of said thermal vias is thermally connected to one of said layers. The thermal vias are grouped into a first group and a second group. The vias assist in dissipating heat generated by the semiconductor chips.

A still further aspect of the invention is a dual band cellular phone comprising a motherboard to which a signal processing module and a dual band power amplifier module are mounted. The dual band power amplifier module and the processing module are serially interconnected between a microphone and an antenna. The first and second chips are positioned on said upper surface of said substrate and electrically connected to components mounted on said upper surface to form two power amplifiers operable independently of each other. The signal processing module switches the dual power amplifier module to operate at one of said radio frequency bands.

Another aspect of the invention involves a method for manufacturing a dual band power amplifier module for a dual band cellular phone. The method comprises the steps of:

etching a substrate having multiple layers of electrically conducting material in accordance with a layout of an electrical circuit diagram;

mounting passive electrical components to an upper surface of said substrate;

mounting a first semiconductor chip to said upper surface, said first chip comprising a first integrated circuit operating as part of a first power amplifier and being adapted for a first radio frequency band;

mounting a second semiconductor chip to said upper surface, said second chip comprising a second integrated circuit operating as part of a second power amplifier and being adapted for a second radio frequency band; and electrically connecting said first and second chips to said upper surface of said substrate to form two power amplifiers operable independently of each other on a single multiple layer substrate.

BRIEF DESCRIPTION OF THE DRAWINGS

The above-mentioned and other features of the invention will now be described with reference to the drawings of a preferred embodiment of an amplifier module for a dual band cellular phone. In the drawings, same components have same reference numerals. The illustrated embodiment is intended to illustrate, but not to limit the invention. The drawings contain the following figures:

FIG. 1 is a schematic illustration of a cellular phone cut away to a portion of the motherboard;

FIG. 1A is a simplified illustration of a transmit path of the cellular phone shown in FIG. 1;

DETAILED DESCRIPTION OF THE PREFERRED EMBODIMENT

Figure 2:
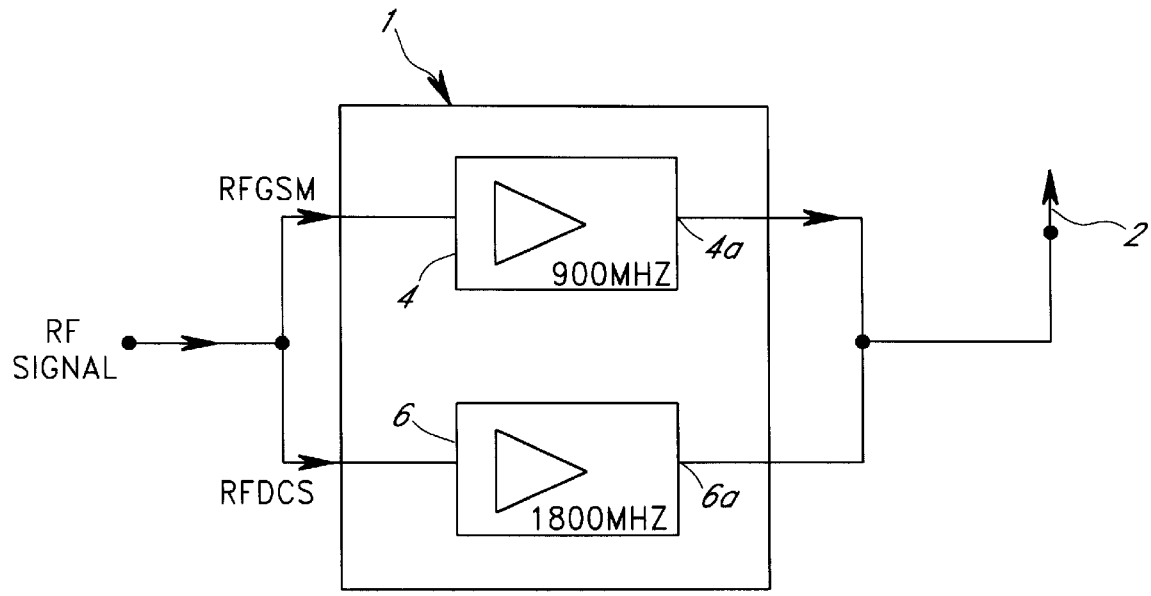
FIG. 2 is a schematic illustration of a power amplifier module for a cellular phone made in accordance with the present invention.

A mobile communications system, for example, according to the GSM standard is structured to have a variety of individual regions called cells, and to comprise a variety of fixed transmitter stations, called base stations, and a plurality of mobile stations, the cellular phones. Usually, one base station defines one cell and handles telephone traffic to and from cellular phones which are located in the cell.

FIG. 1 schematically illustrates a dual band cellular phone 3 made in accordance with the invention including an antenna 2. A portion of the case of the dual band cellular phone 3 is cut away to show a schematic view of a motherboard of the cellular phone 3 with a dual band power amplifier module I positioned thereon. Although not shown in FIG. 1, those skilled in the art will appreciate that the cellular phone 3 comprises a plurality of other components and functional modules, such as the components of the receive and transmit paths. The cellular phone 3 further includes a display and a keypad.

The dual band phone 3 further includes several functional modules. Thus, for example, the receive path includes a radio frequency (RF) receiver, an analog-to-digital converter, a demultiplexer and a demodulator. The transmit path comprises a multiplexer, modulator, digital-to-analog converter and an RF transmitter. Further functional modules include, for example, a channel coder/decoder and a speech coder/decoder. Both the RF receiver and the RF transmitter are usually connected to the antenna 2 by means of a diode switch which connects the antenna 2 either to the RF receiver or to the RF transmitter. The RF transmitter comprises an amplifier stage for shaping and amplifying the RF signals according to a defined power level versus time profile, before the RF signals are fed to the antenna and emitted as radio signals.

Figure 1a illustrates a simplified embodiment of the transmit path of the dual band cellular phone 3. Within the cellular phone 3, a processing module 7 and the dual band power amplifier module 1 are cascaded on the motherboard between the antenna 2 and a microphone 9 of the cellular phone 3. In this simplified illustration, the processing module 7 performs most speech and signal processing, for example, encoding and channel encoding. The signal processing further includes modulating an RF carrier of either 900 MHz or 1800 MHz with the processed speech signal.

FIG. 2 shows a simplified block diagram of the dual band power amplifier module 1 shown in FIG. 1. The power amplifier module 1 includes two power amplifiers 4, 6 each having an output 4a, 6a connected to the antenna 2. The antenna 2 is further connected to an RF receiver (not shown) located within the cellular phone 3. The power amplifiers 4, 6 receive an RF signal from an RF signal source (not shown) located within the cellular phone 3. For instance, the RF signal source can may be included in the processing module 7 shown in FIG. 1a. In the illustrated embodiment the RF carrier advantageously has a frequency of 900 MHz or 1800 MHz depending on which RF carrier (GSM or DCS) is chosen.

The power amplifiers 4, 6 are associated with feedback control loops (not shown) located on the motherboard 5. These control loops control the power amplifiers to ensure that an amplified RF signal output from an activated power amplifier 4, 6 conforms with the defined output power level versus time profile. Each feedback control loop compares the output RF signal of the power amplifier with a reference signal and generates a control signal to control the power amplifier.

In the illustrated embodiment, the power amplifier 4 operates in a frequency band around 900 MHz, and the power amplifier 6 operates in a frequency band around 1800 MHz. The power amplifier 4 receives an RF signal RFGSM, and the power amplifier 6 receives an RF signal RFDCS. However, those skilled in the art will appreciate that the power amplifiers 4, 6 can operate at another pair of frequency bands, for example, 900/1900 MHz. Because the cellular phone 3 can operate at the two frequencies, it is referred to as a dual band cellular phone. However, it should be understood that only one power amplifier 4, 6 is active at a time.

Although the specific embodiments of the power amplifier module I are described with reference to a dual band cellular phone, it is contemplated that the invention is also applicable to cellular phones which can operate at more than two different frequency bands. These frequency bands may include these assigned for AMPS or PCS, or newly assigned frequency bands for mobile communications.

Which frequency band the cellular phone 3 uses to communicate with the base station is determined by external factors. That is, a user may deliberately set the cellular phone to operate in one of the two frequency bands depending on the mobile communications system (GSM900, DCS1800, GSM1900) the user chooses. Alternatively, the frequency band of the cellular phone 3 can be determined by the base station which currently serves the cellular phone 3. Depending on the current traffic in the cell served by the base station, a dynamic change of the frequency band may be necessary to allow more telephone traffic. In this case, the base station forces the cellular phone 3 to operate in one of the two frequency bands, at least for a certain period of time.

Figure 3:
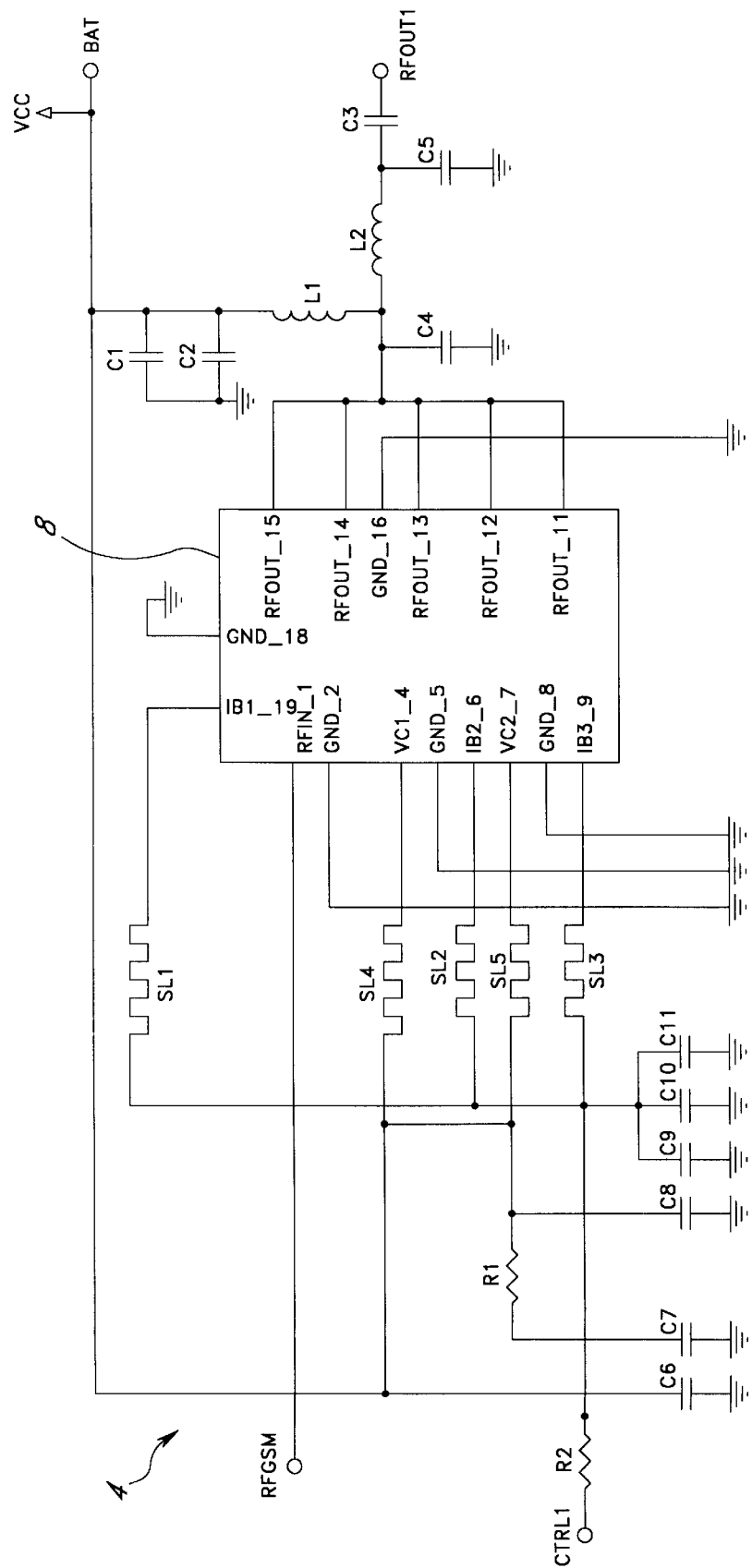
FIG. 3 is a circuit diagram of a first power amplifier included in the power amplifier module of FIG. 2.

FIG. 3 is a circuit diagram of the power amplifier 4 included in the power amplifier module 1 of FIG. 2. The power amplifier 4 comprises a semiconductor chip 8 with an integrated amplifier circuit which is adapted to the frequency band of 900 MHz. Such a chip 8 having a size of about 55 mils×65.74 mils (1.4 mm×1.67 mm), wherein 1 mil=$\frac{1}{1000}$ inch, or 1 mil=0.0254 millimeter, is also known as a die. The chip 8 is connected to external components via lines and microstrips as set forth below.

Figure 2A:
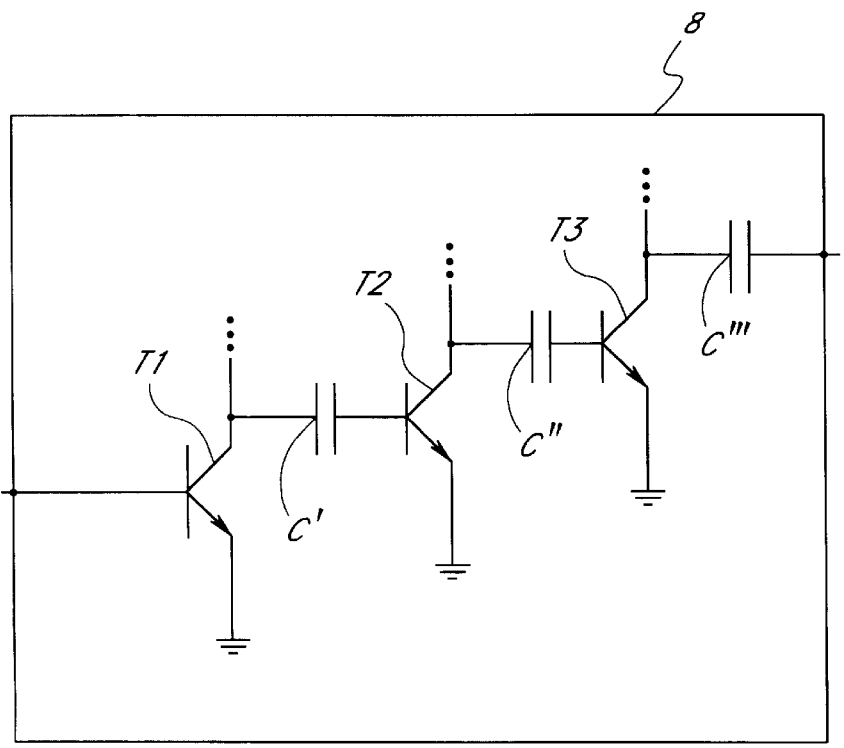
FIG. 2a is a principle illustration of an internal circuit of a semiconductor chip.

The chip 8 may advantageously be the same die as that used in a power amplifier device RF130 available from Rockwell Semiconductor Systems as Order No. W229. The data sheet of this device RF130 is included as Appendix A which forms a part this specification. The integrated amplifier circuit of the chip 8 includes a three-stage amplifier with heterojunction bipolar transistors (HBT) in Gallium Arsenide (GaAs) technology. A principle illustration to the internal circuit of the chip 8 including three cascaded transistors T1, T2, T3 is shown in FIG. 2a. The collector of the transistor T1 and the basis of the transistor T2 are AC coupled through a serial capacitor C'. Similarly, the collector of the transistor T2 and the basis of the transistor T3 are AC coupled through a serial capacitor C". The collector of the transistor T3 is connected to a serial capacitor C'" which is interface the output of the chip 8 and the third amplifier stage.

Figure 4:
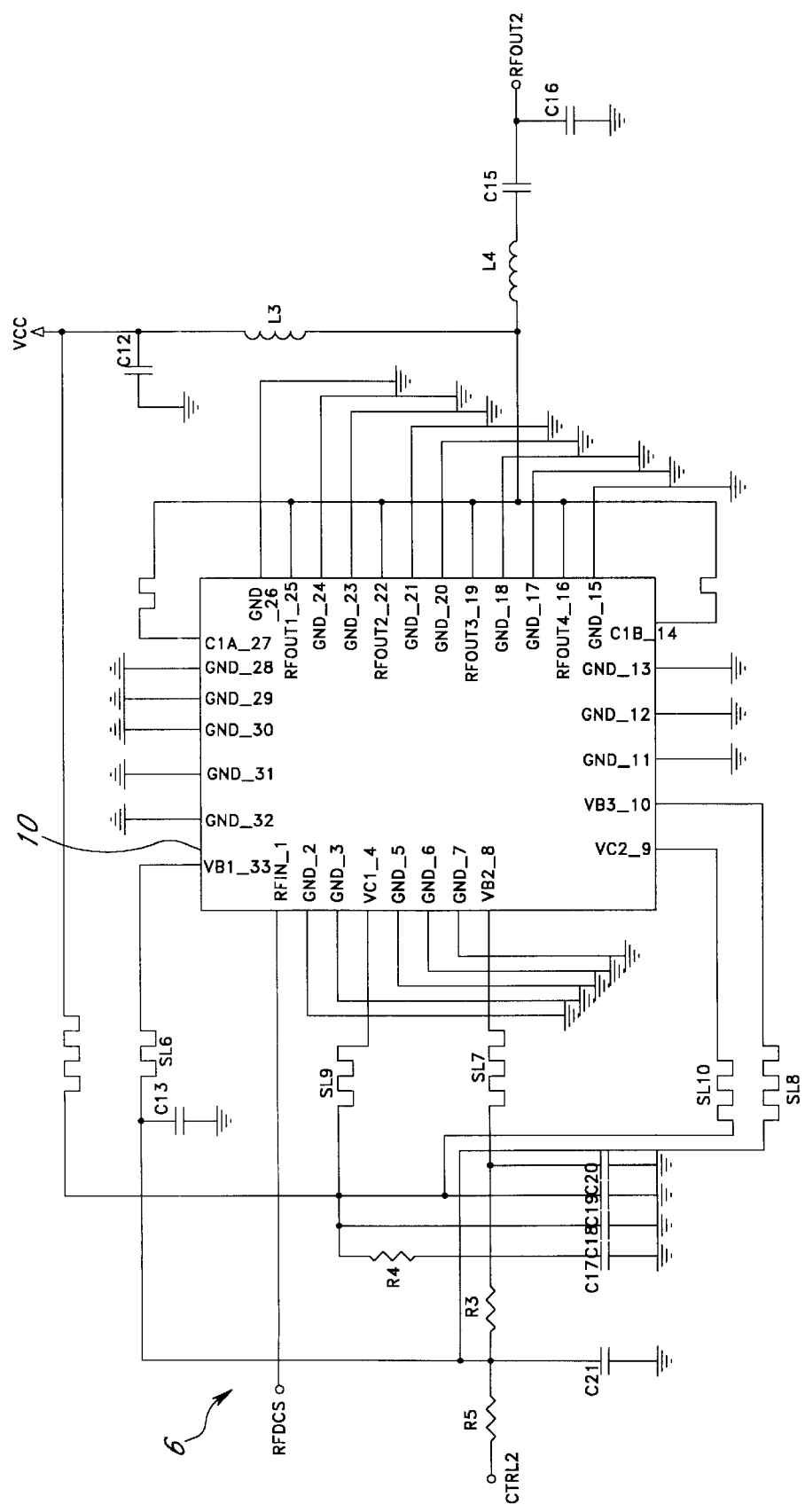
FIG. 4 is a circuit diagram of a second power amplifier included in the power amplifier module of FIG. 2.

In FIGS. 3 and 4, all pins of the chips 8, 10 are labeled with capital letters followed by a number indicating a contact pad number on the respective chip 8, 10.

The chip 8 has nineteen contact pads, seven of these pads are used for connecting the chip 8 to ground (GND). Further, the chip 8 has an input pad RFIN for the RF signal RFGSM and five output pads RFOUT, which are connected to each other, for the amplified RF signal. The chip 8 has three pads IB1, IB2, IB3 which receive a bias current, respectively, and two pads VC1, VC2 which receive a voltage, respectively, derived from a voltage of a battery of the cellular phone 3. The final stage of the internal circuit receives the voltage supply via an inductor L1.

The pads IB1, IB2, IB3 are wire bonded to microstrips SL1, SL2, SL3, respectively, which have preset electrical characteristics, e.g., resistance, dependent on the geometry (length, width and thickness) of the microstrip. Although the widths and lengths varies between the microstrips, advantageously the thickness of all microstrips is about 0.5 mils. The microstrip SL1 preferably has a width of 4 mils and a length of 133 mils. A first end of the microstrip SL1 is connected to the pad IB1 and a second end of the microstrip SL1 is connected to a first terminal of a resistor R2 (5.1 ohms). A second terminal of the resistor R2 is connected to a source (not shown) of a first control signal CTRL1. The microstrip SL2 preferably has a width of 4 mils and a length of 205 mils. A first end is connected to the pad IB2 and a second end of the microstrip SL2 is connected to the first terminal of the resistor R2. The microstrip SL3 preferably has a width of 4 mils and a length of 133 mils. A first end is connected to the pad IB3 and a second end of the microstrip SL3 is connected to the first terminal of the resistor R2. The first terminal of the resistor R2 is also connected to grounded capacitors C9 (33 pF), C10 (100 nF), C11 (33 pF). By means of the control signal CTRL1 the power amplifier 4 can be turned on and off. When the control signal CTRL1 is active, that is, the cellular phone 3 operates in the 900 MHz band and the power amplifier 4 is turned on, the resistor R2 and the microstrips SL1, SL2, SL3 determine the current fed to the respective pads IB1, IB2, IB3.

The pads VC1, VC2 are connected to microstrips SL4, SL5. The microstrip SL4 preferably has a width of 4 mils and a length of 234 mils. A first end of the microstrip SL4 is connected to the pad VC1 and a second end of the microstrip SL4 is connected to a first terminal of a resistor R1 (5.1 ohms). A second terminal of the resistor R1 is connected to a grounded capacitor C7 (33 pF). The microstrip SL5 preferably has a width of 4 mils and a length of 67 mils. A first end of the microstrip SL5 is connected to the pad VC2 and a second end of the microstrip SL5 is connected to the first terminal of the resistor R1. The first terminal of the resistor R1 is connected to a grounded capacitor C8 (100 nF) and to an input BAT for the battery voltage. The microstrips SL4, SL5 determine the supply voltage applied to the chip 8. The first terminal of the resistor R1 is also connected to a grounded capacitor C6 (1000 pF).

Interconnected between the output pad RFOUT and a power amplifier output RFOUT1, which corresponds to the output 4a in FIG. 2, is a network comprising capacitors C1 (1000 pF), C2 (33 pF), C3 (33 pF), C4 (1.9 pF) and inductors L1 (10 nH) and L2 (1.5 nH). This network matches an impedance (typically about 4 ohms) of the integrated amplifier circuit of the chip 8 to an impedance (typically 50 ohms) of a line leading to the antenna 2. Additionally, the matching network has a low pass filter characteristic. The output pad RFOUT is connected to the capacitor C4, which is grounded, to the inductance L1, which is connected to the input BAT. The output pad RFOUT is further connected to the inductance L2 which is in series with the capacitor C3 and the output RFOUT1. Between the inductance L2 and the capacitor C3 the capacitor C5 (10 pF) is connected to ground. Further, the capacitors C1, C2 are grounded and connected to the input BAT.

FIG. 4 shows a circuit diagram of the power amplifier 6 included in the power amplifier module 1 of FIG. 2. The power amplifier 6 comprises a semiconductor chip 10 with an integrated amplifier circuit which is adapted to the frequency band of 1800 MHz. The chip 10 is connected to external components via microstrips as set forth below. The chip 10 may advantageously be the same die as that used in a power amplifier device RF230 available from Rockwell Semiconductor Systems as Order No. W225. The data sheet of this device RF230 is included as Appendix B which forms a part of this specification. The integrated amplifier circuit of the chip 10 includes a three-stage amplifier with heterojunction bipolar transistors in Gallium Arsenide (GaAs) technology. The chip 10 has a size of about 47.05 mils×52.36 mils (1.196 mm×1.330 mm). The internal circuit for this chip 10 corresponds to that shown in FIG. 2A.

The chip 10 has several pads (GND) for connecting the chip 10 to ground with wire bonds. Further, the chip 10 has an input pad RFIN' for the RF signal RFDCS and an output pad RFOUT' for the amplified RF signal. The chip 10 has three pads VB1, VB2, VB3 which receive a bias current, respectively, and two pads VC1', VC2' which receive a voltage, respectively, derived from the battery voltage. The final stage of the internal circuit of the chip 10 receives the voltage supply via an inductor L3.

The pads VB1, VB2, VB3 are connected to microstrips SL6, SL7, SL8, respectively. The microstrip SL6 preferably has a width of 6 mils and a length of 400 mils. A first end is connected to the pad VB1 and a second end of the microstrip SL6 is connected to a first terminal of a resistor R5 (5.1 ohms) and to a grounded capacitor C13 (1000 pF). A second terminal of the resistor R5 is connected to a source (not shown) of a second control signal CTRL2. The microstrip SL7 preferably has a width of 6 mils and a length of 300 mils. A first end is connected to the pad VB2 and a second end of the microstrip SL7 is connected to a first terminal of a resistor R3 (10 ohms) and to a grounded capacitor C20 (1000 pF). The microstrip SL8 preferably has a width of 6 mils and a length of 300 mils. A first end is connected to the pad VB3 and a second end of the microstrip SL8 is connected to the first terminal of the resistor R5. The first terminal of the resistor R5 is also connected to a grounded capacitor C21 (1000 pF). The control signal CTRL2 turns the power amplifier 6 on and off. When the control signal CTRL2 is active, that is, the cellular phone 3 operates in the 1800 MHz band and the power amplifier 6 is turned on, the resistor R3 and the microstrips SL6, SL7, SL8 determine the current fed to the respective pads VB1, VB2, VB3.

The pads VC1', VC2' are connected to microstrips SL9, SL10. The microstrip SL9 preferably has a width of 10 mils and a length of 100 mils. A first end of the microstrip SL9 is connected to the pad VC1' and a second end of the microstrip SL9 is connected to a first terminal of a resistor R4 (20 ohms). A second terminal of the resistor R4 is connected to a grounded capacitor C17 (1000 pF). The microstrip SL10 preferably has a width of 10 mils and a length of 50 mils. A first end of the microstrip SL10 is connected to the pad VC2' and a second end of the microstrip SL10 is connected to the first terminal of the resistor R4. The first terminal of the resistor R4 is connected to grounded capacitors C18 (10 pF), C19 (1000 pF) and to an input BAT for an internal power supply (VCC) derived from the battery voltage. The microstrips SL4, SL5 determine the supply voltage applied to the chip 10.

Interconnected between the output pad RFOUT and a power amplifier output RFOUT2, which corresponds to the output 6a in FIG. 2, is a network comprising capacitors C12 (10 pF), C15 (4.7 pF), C16 (2.7 pF) and inductances L3 (10 nH) and L4 (2.2 nH). The network matches the output impedance (typically about 6–7 ohms) of the integrated amplifier circuit of the chip 10 to an impedance of a line leading to the antenna 2, similar to the matching network shown in FIG. 3. The output pad RFOUT of the chip 10 is connected to the inductance L4 which is in series with the capacitor 15 and the output RFOUT2. The output RFOUT2 is further connected to the capacitor C16 which is grounded. The inductance L3 is connected to the output pad RFOUT of the chip 10 and to the internal power supply (VCC) which is derived from the battery voltage. The capacitor C12 is connected to the internal power supply VCC and grounded.

The amplifier module 1 with the two power amplifiers 4, 6 and the surrounding components are positioned on the board 12 which preferably has four metal layers. The layout of the board 12 has to comply with a variety of electrical requirements. The power amplifiers 4, 6 and the other components (see FIGS. 3, 4) have to be positioned as close as possible to make the amplifier module 1 as small as possible, and to keep bond wires as short as possible to keep parasitic inductances as low as possible to allow operation in the RF range. On the other hand, the power amplifiers 4, 6 and the other components have to be positioned sufficiently spaced apart to avoid cross talk or other unwanted effects. Layout techniques which allow the use of several electrical layers on the board assist in achieving these requirements. The layout of the power amplifiers 4, 6 on the board is optimized using computer assisted layout techniques before the final layout is implemented on the board.

Figure 5:
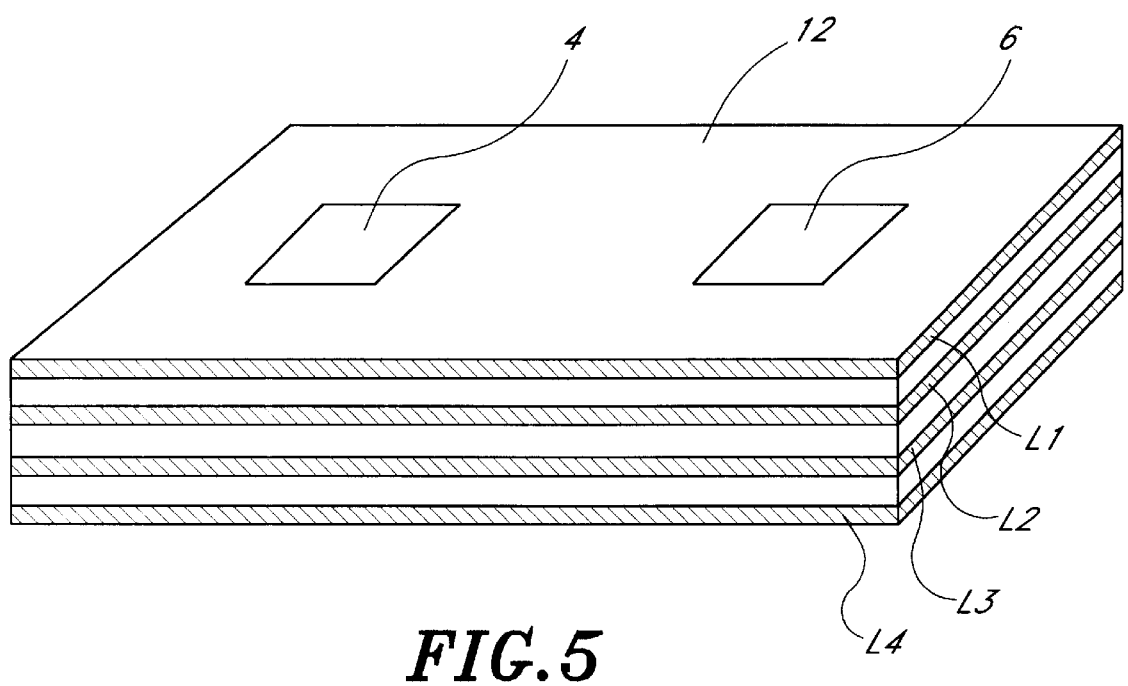
FIG. 5 is a schematic perspective view of a multiple layer printed circuit board made in accordance with the present invention.

In accordance with a preferred embodiment of the board 12, FIG. 5 shows a perspective view of the board 12 having four layers L1, L2, L3, L4 of copper and three layers of PCB substrate. Preferably, exposed copper surfaces are covered with gold or palladium. The power amplifiers 4, 6 are shown to illustrate the position of the power amplifiers 4, 6 on the board 12 and relative to each other. Typically, the board 12 has a length of about 0.62 inches, a width of about 0.39 inches, and a thickness of about 25 mils, each layer of PCB substrate having a thickness of about 8 mils and each layer of copper having a thickness of about 0.25 mils. Preferably, the board 12 has a dielectric constant $\epsilon_r$=4.8. For example, multiple layer printed circuit boards of the type appropriate for this application are available from Details Inc., Anaheim, Calif. 92806. This company is also capable of edging the layers and implementing the final multilayer layout.

Figure 6:
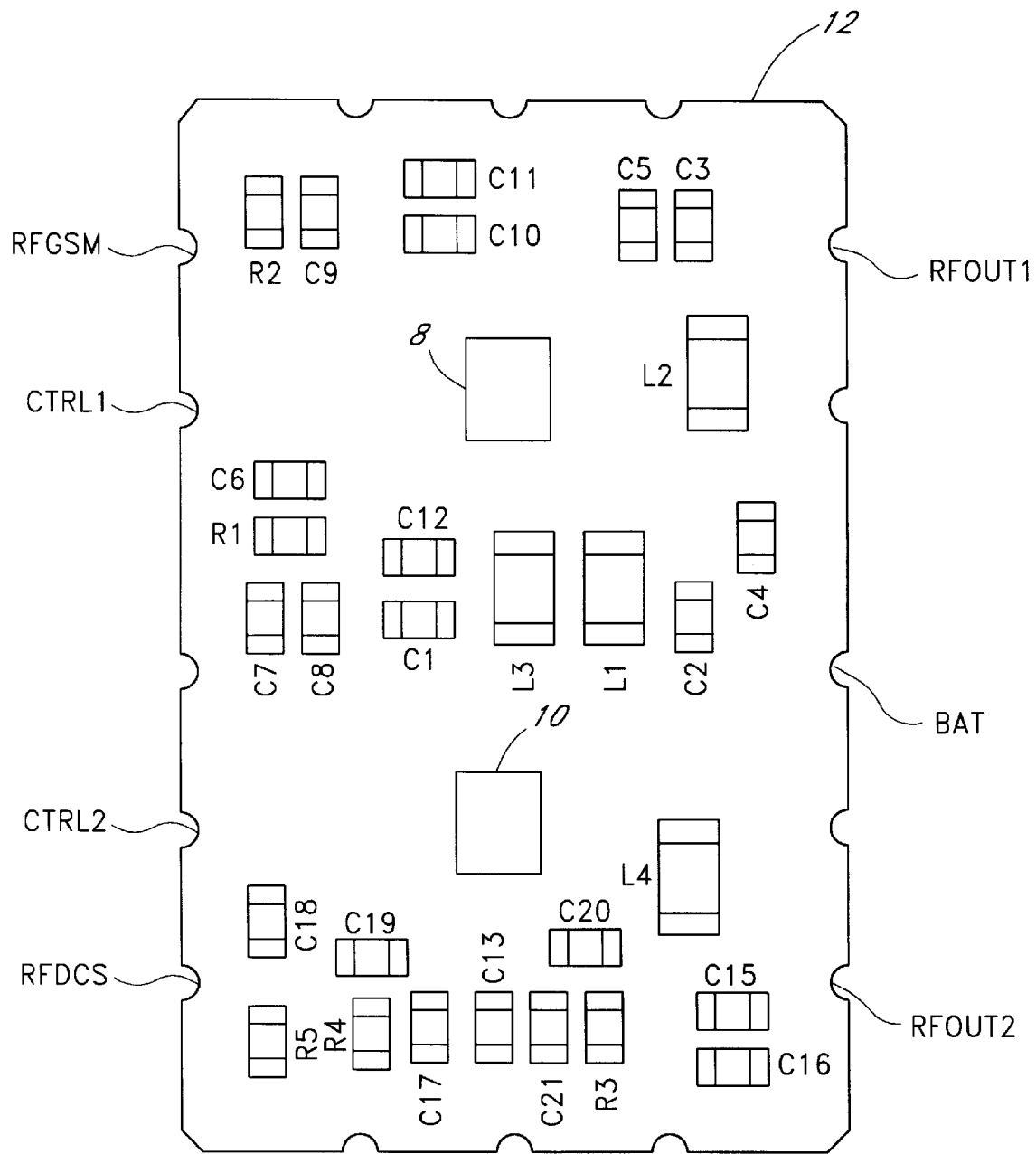
FIG. 6 is a schematic top plan of the board of FIG. 5 shown with components.

FIG. 6 shows a schematic top plan view (component level) of a preferred embodiment of the board 12 with the power amplifier chips 8, 10 and the other components needed to implement the power amplifiers 4, 6 shown in FIGS. 3, 4. The chips 8, 10 and the other components are positioned in accordance with a preferred layout. Inputs and outputs are labeled in accordance with the previous FIGS. 2–5. The components which include capacitors and inductances are surface mounted devices (SMD) having premetalized regions for soldering to the board. Preferably, the surface mounted devices are soldered to the board 12 before the chips 8, 10 are glued to the board 12. The melting temperature (about 221 degrees celsius) of the solder used for mounting the SMDs has to be higher than the melting temperature (about 183 degrees celsius) of the solder used for mounting the power amplifier module to the motherboard. As described below, backplane of the power amplifier module 1 is covered with copper and gold plated. A variety of solder dots is applied to the gold surface.

Figure 7:
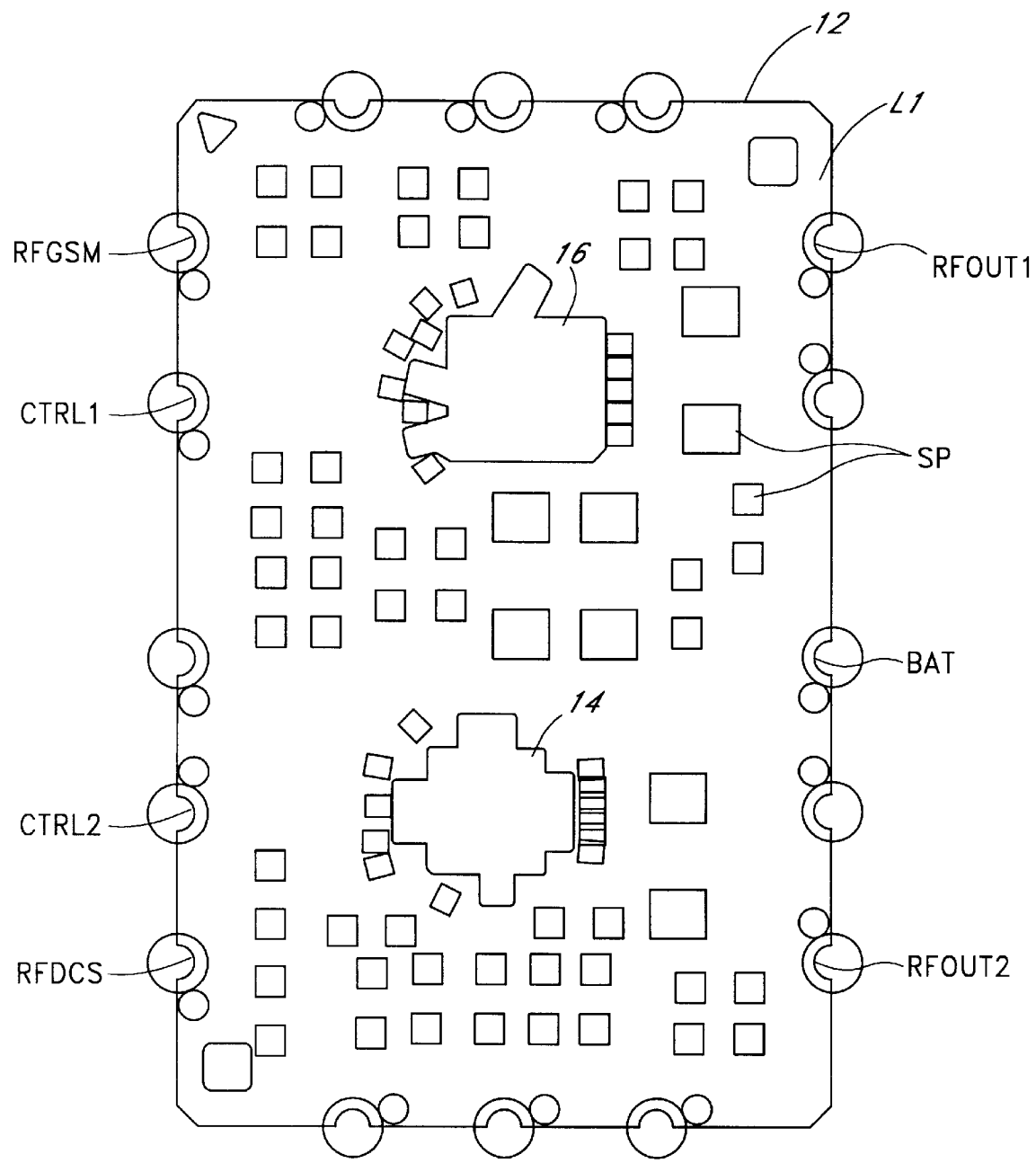
FIGS. 7 and 8 show an embodiment of a first layer of the board.

FIG. 7 shows the surface of the board 12 with an applied solder mask leaving a plurality of solder points SP uncovered. The size of the solder points SP varies, a typical size is smaller than 16 mils×16 mils. Preferably, the material for the solder mask is Taiyo PSR 4000. The SMDs are placed on top of the uncovered solder points SP. Further, there are two regions 14, 16 shown, located below the chips 8, 10, respectively. The regions 14, 16 are substantially larger than the solder points SP and cover vias (shown in FIG. 8) which serve to conduct heat generated by an active chip 8, 10 away from the chip 8, 10 as explained below.

Figure 8:
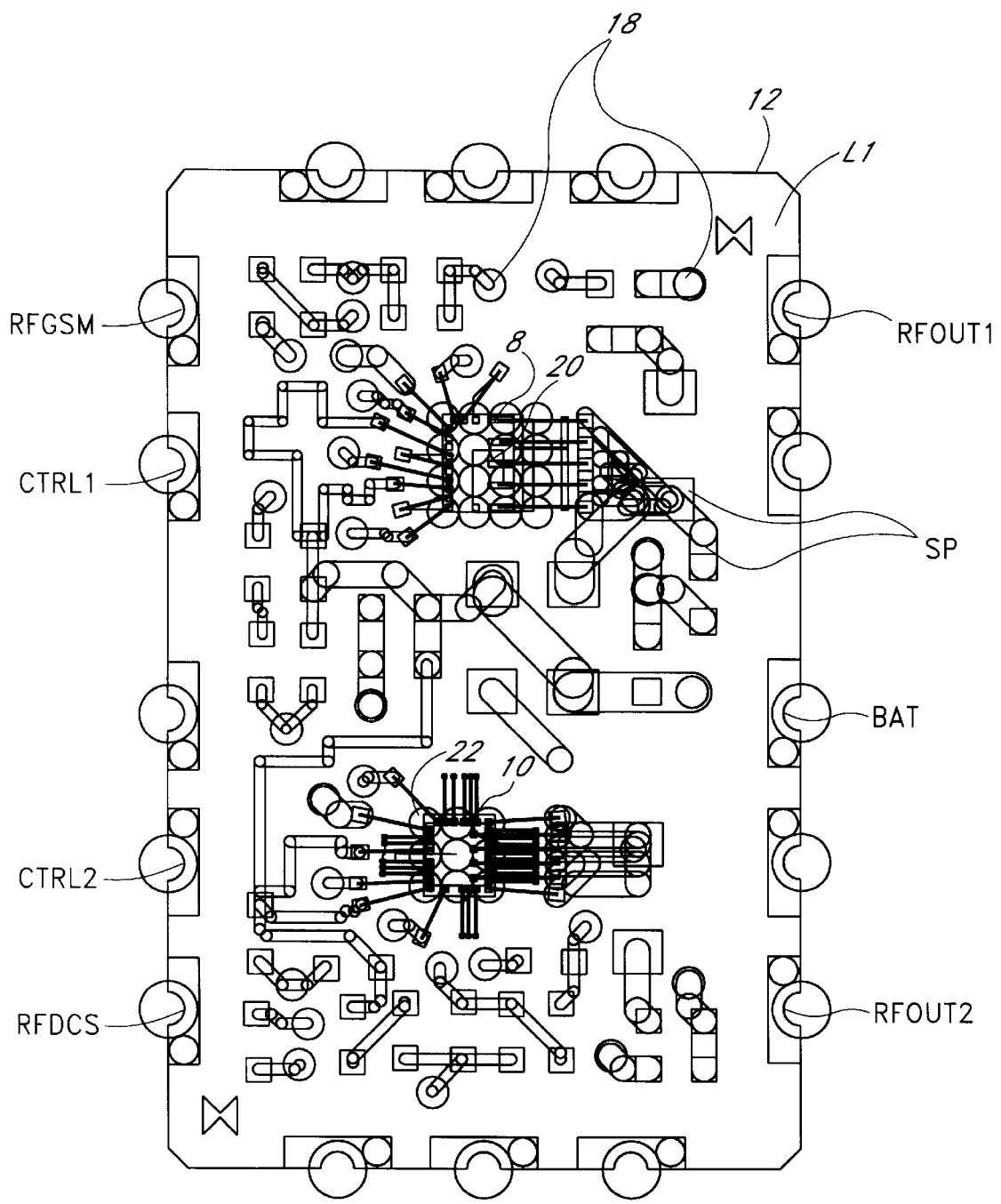
Figure 12:
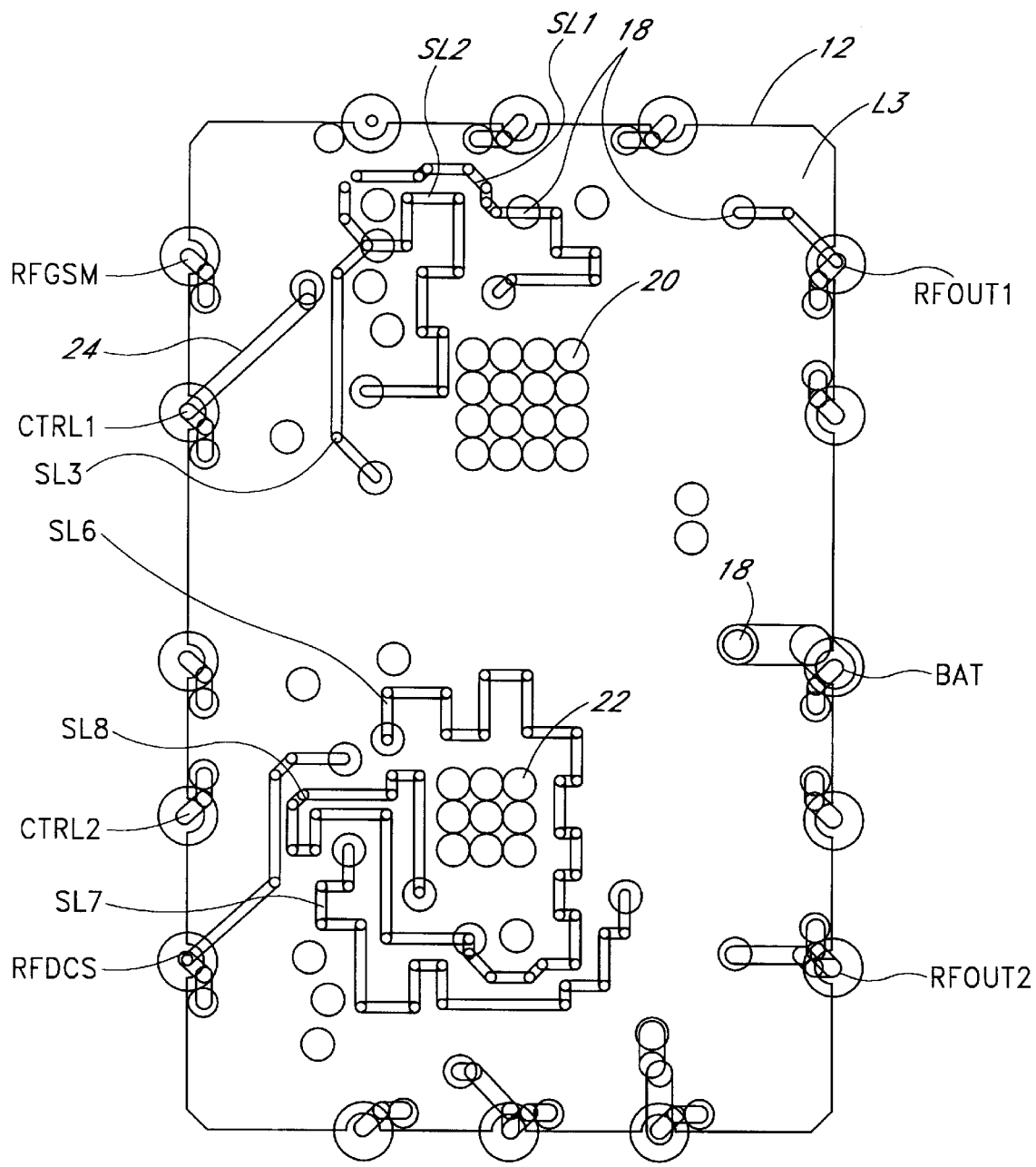

FIG. 8 shows the surface (layer L1) of the board 12 with the chips 8, 10 positioned and contacted through wire bonds to bond pads and/or to solder points as it is known in the art. The length of the wire bonds depends on the height of the chips 8, 10. A typical length for a wire bond from the chip 8,10 to ground is about 30 mils, and a typical length for a wire bond from the chip 8, 10 to an input or output pad is about 40 mils. Electrical lines, such as the microstrips SL4, SL5, SL9, SL10 (FIGS. 4, 5), interconnecting some of the solder points SP are shown on the surface of the board 12. The microstrips SL4, SL5, SL9, SL10 are connected to the internal power supply (battery voltage/VCC). The microstrips SL4, SL5, SL9, SL10 are part of collector circuits (output circuits) of the internal transistors of the chips 8, 10. Contrary to that, the microstrips SL1, SL2, SL3, SL6, SL7, SL8 (FIGS. 3, 4) are part of basis circuits (input circuits) of the internal transistors of the chips 8, 10. The microstrips SL1, SL2, SL3, SL6, SL7, SL8 are included in the third copper layer L3 as shown in FIG. 12. The collector circuits and the basis circuits, that is, the input and output circuits, are separated through one copper layer L2 (FIGS. 9, 10) to minimize coupling and to prevent the oscillations of the power amplifiers.

Figure 15:
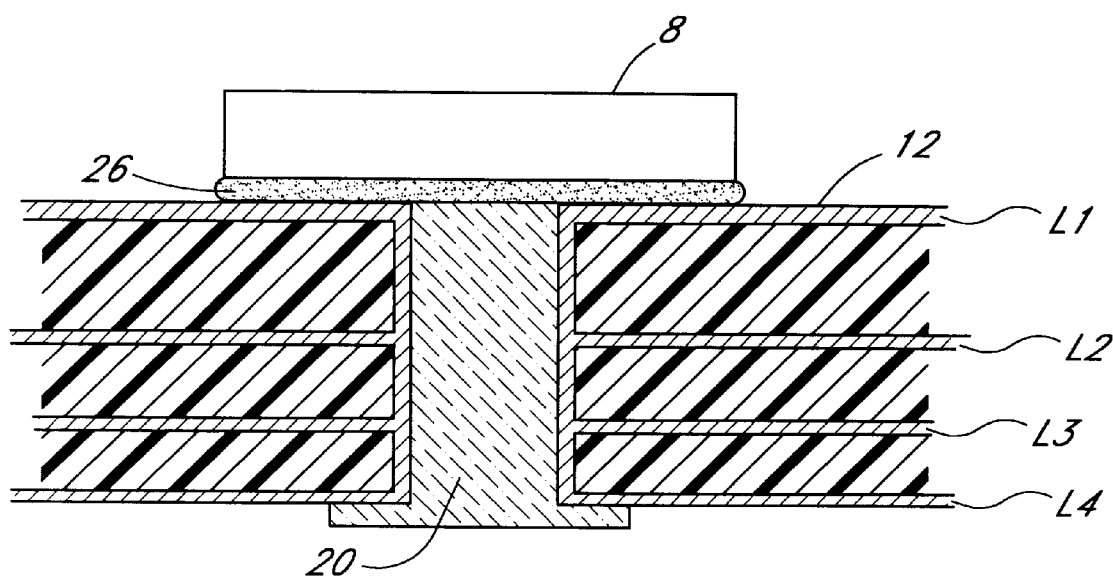
FIG. 15 is a side cross sectional view of the multiple layer printed circuit board with a chip mounted thereon.

As indicated in FIG. 8, the surface includes several vias, generally labeled with reference numeral 18, which electrically connect to all metal layers of the board 12. Advantageously, these vias 18 assist in dissipating heat generated by the chips 8, 10. Underneath the chips 8, 10, additional vias 20, 22 are indicated which further assist in dissipating the generated heat as described below in greater detail (FIG. 15).

Figure 9:
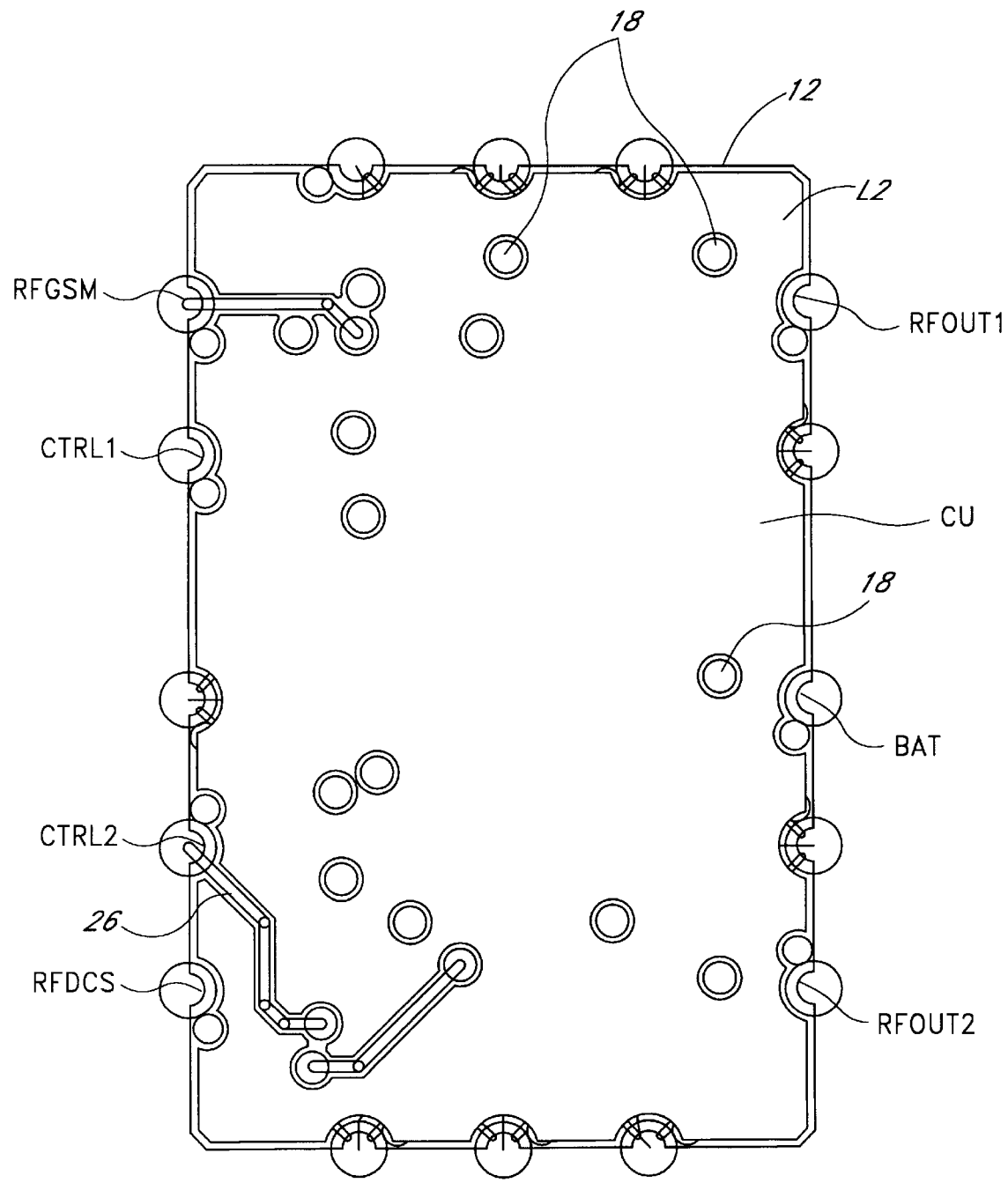
FIGS. 9 and 10 show an embodiment of a second layer of the board.
Figure 10:
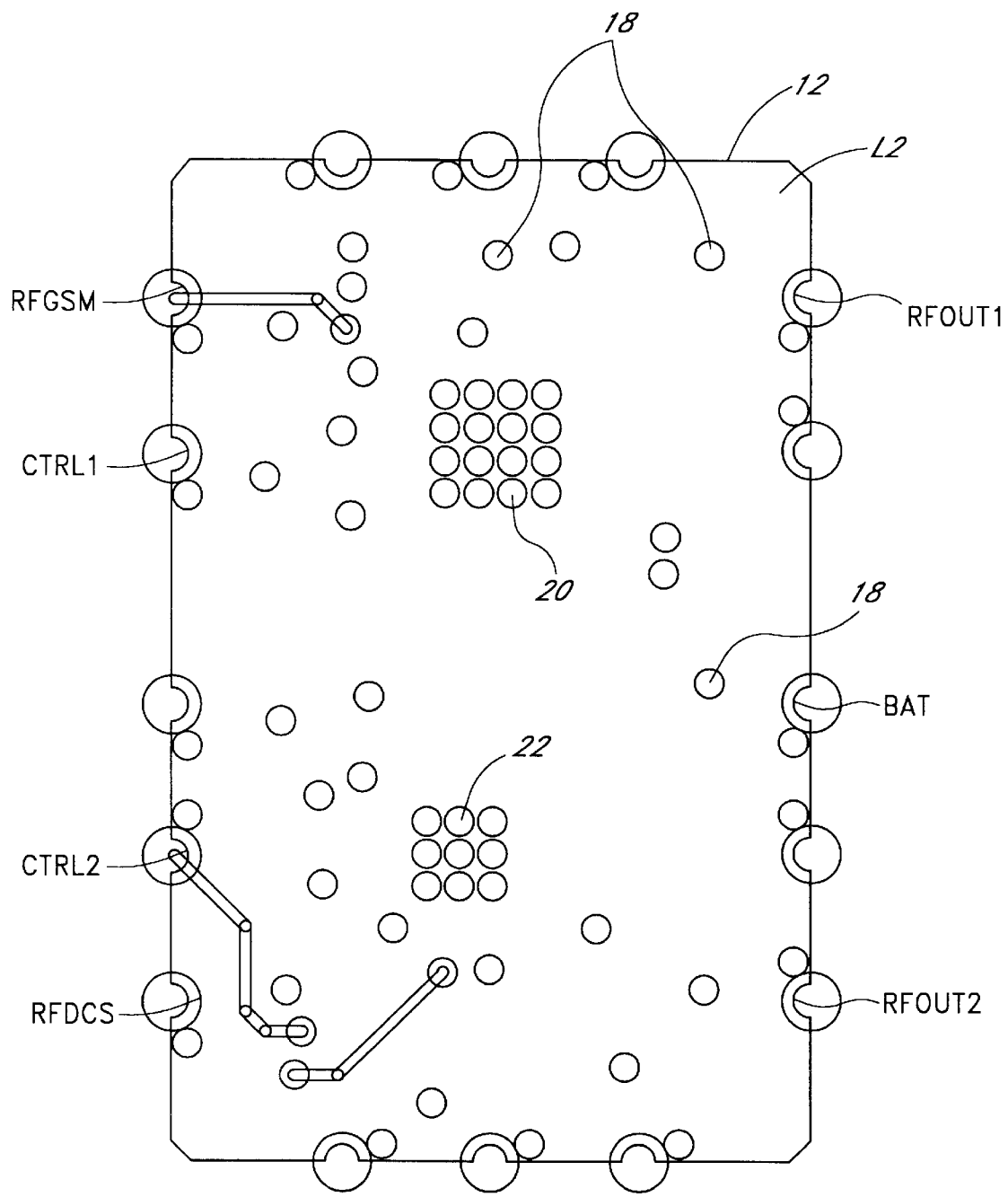

FIG. 9 shows a preferred layout of the second metal layer L2 of the board 12. The layer L2 shows the vias 18 and electrical connections 26. Most of the area of the layer L2 is covered with copper. The layer L2 without the copper is shown in FIG. 10 to illustrate the vias 20, 22.

Figure 11:
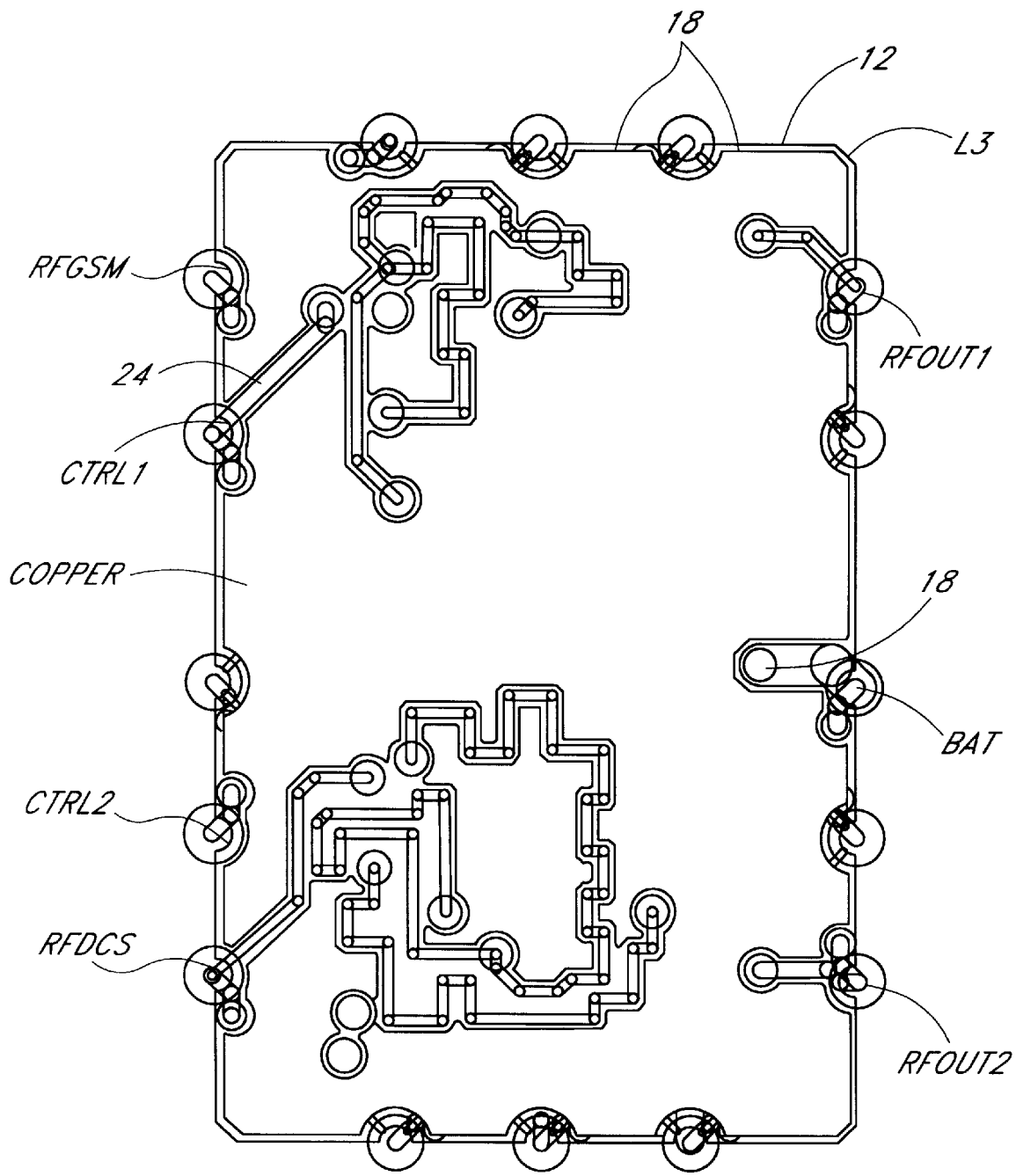
FIGS. 11 and 12 show an embodiment of a third layer of the board.

FIG. 11 shows a preferred layout of the third metal layer L3 of the board 12. In this third layer L3, the vias 18 and electrical connections 24 are visible. The vias 18 and the connections 24 are electrically insulated from the remaining copper area. FIG. 12 shows a view of the layer L2 without the copper to illustrate the vias 20, 22.

Figure 13:
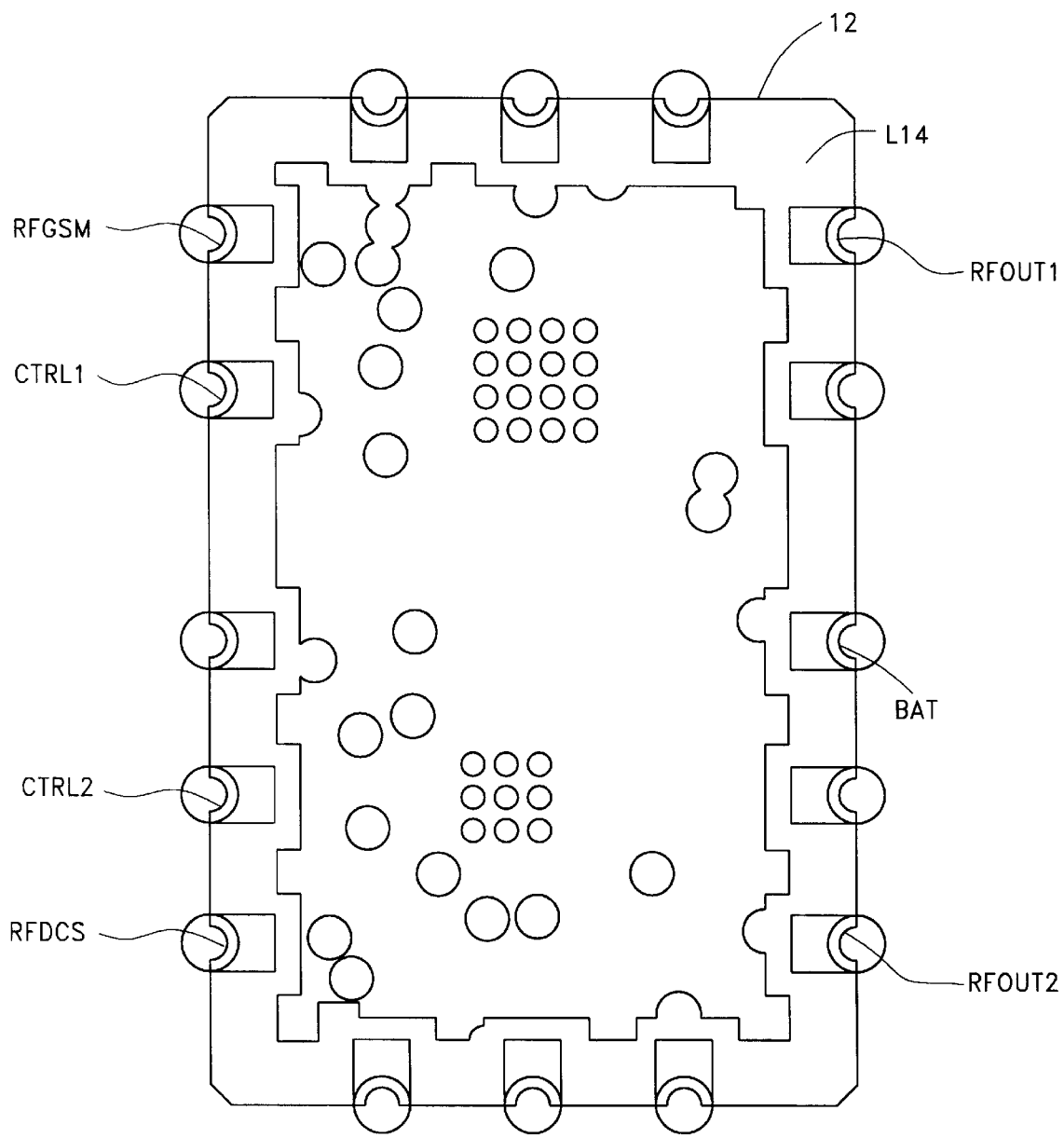
FIG. 13 shows an embodiment of a fourth layer of the board.

FIG. 13 shows a layout of a backplane of the board 12 which is mainly covered with a gold plated copper layer L4. In a preferred layout of the backplane, the copper layer L4 covers only two circular areas below the positions of the chips 8, 10. The two circular areas may overlap to a certain extent. Advantageously, the backplane is covered with a variety of small solder pads, squares or dots. The used solder has a lower melting temperature than the solder used for mounting the surface mounted devices. With the applied solder dots the amplifier module is ready for automated positioning and soldering to the motherboard of a dual band cellular phone.

Figure 14:
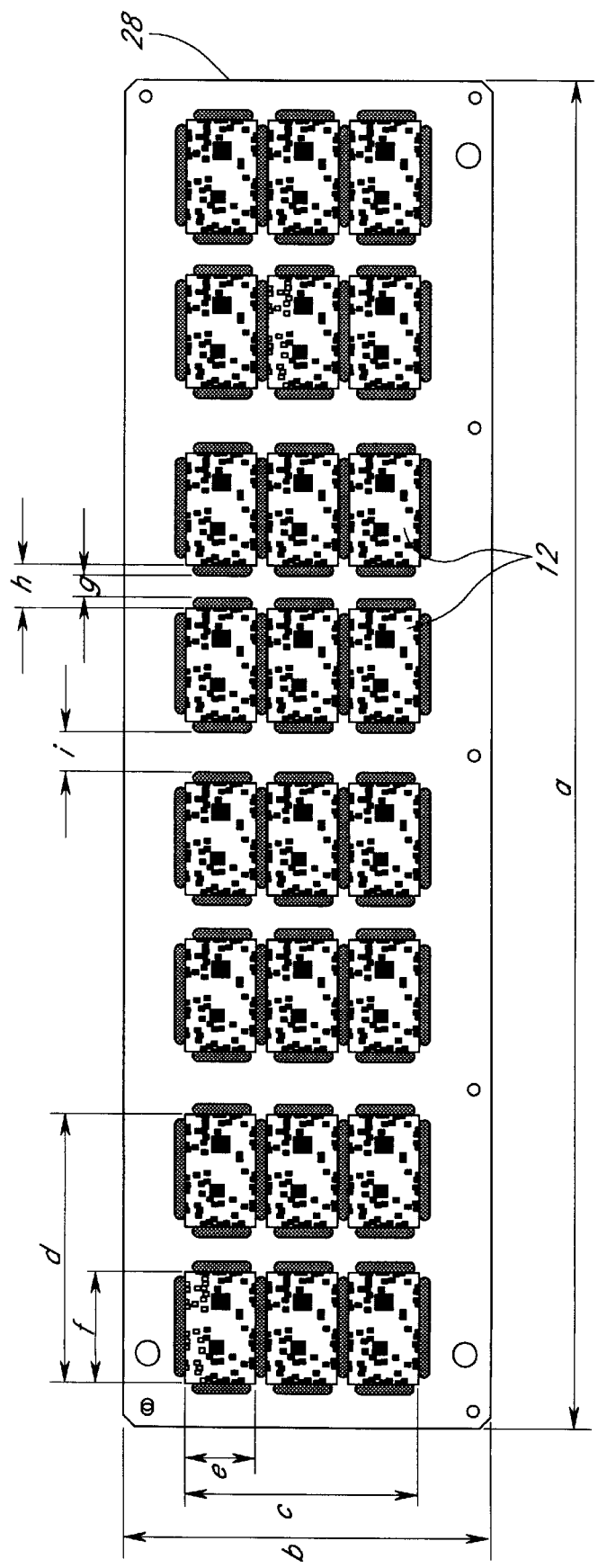
FIG. 14 shows an embodiment of a panel comprising several individual boards.

The board 12 for carrying the chips 8, 10 is usually not manufactured individually but rather together with several other boards on one panel. FIG. 14 shows a panel 28 which comprises a variety of individual boards 12. The illustrated panel 28 comprises 24 individual boards 12 which can easily be punched out from the panel 28. In a preferred embodiment, the panel has approximately a length a =7.48 inches and a width b=1.96 inches. FIG. 14 shows further approximate dimensions (in inches): c=1.29, d=1.48, e=0.62, f=0.39, g=0.13, h=0.25, i=0.23.

When active, the chip 8 outputs an RF signal having about 3.5 Watts electrical power, and the chip 10 outputs an RF signal having about 2 Watts electrical power. However, the chips 8, 10 may not be exposed to a temperature above about 140 degrees Celsius. Therefore, heat generated by the chips 8, 10 has to be dissipated to avoid overheating and to ensure adequate operation of the chips 8, 10. In the embodiment of the amplifier module 1, the board 12 comprises the vias 20, 22 (FIG. 8) to assist in sufficient dissipation of the generated heat. The chips 8, 10 are mounted above the vias 20, 22.

FIG. 15 shows a side cross sectional view of the board 12 having four layers L1–L4 of copper. In FIG. 15, the chip 8 is glued to the board 12 above the via 20. For illustrative purposes, only a single via is shown and the dimensions are not to scale. The chip 8 is fixed to the board 12 through an epoxy 26. The epoxy 26 does not conduct electrical current but has a good heat conductivity to dissipate the heat via the board 12. The via 20 has a diameter of about 10 mils and extends from the first layer L1 to the fourth layer L4. In a preferred embodiment, the wall of the via 20 is covered with copper. However, other suitable materials such as gold may be used. The interior of the via 20 is filled with a material used for the solder mask to prevent the epoxy 26 from entering the via 20. At layer L1, the solder material is leveled, whereas at layer L4 the solder material overlaps to a certain degree.

The epoxy 26 conducts generated heat away from the chip 8 to the board 12. On the board 12, the heat is guide along the layer LI on the surface of the board 12, but also through the via 20. The solder material as well as the copper covering the wall guide the heat away from the chip 8. Because the wall of the via 20 also is thermal contact with the copper layers L2–L4, heat dissipates not only through the via 20 but also through the copper layers L2–L4 which further improves the efficiency of dissipating the heat.

Because the amplifier module 1 according to the present invention comprises two separate semiconductor chips 8, 10 on a common PCB substrate, the amplifier module 1 may be referred to as a multiple chip module (MCM). This module is made in accordance with the specification shown in the sheet entitled "C Dualband GSM, GSM1800 4cell specification" included as Appendix C which forms a part of this application. This module is significantly reduced in size compared to two separate power amplifier modules. This allows manufactures of cellular phones to further reduce the size of the cellular phones. An additional advantage of the amplifier module 1 is that no package is necessary. Relatively long bond wires to pins are therefore avoided, as well as the pins as such, which can cause unwanted inductances. The chips 8, 10 can be covered by a cover of epoxy or other suitable material. No further packaging is required. Therefore, no negative influence (unwanted inductances) from the package to the circuits has to be considered. Further, because of its small size, the module can be handled with conventional equipment used for automated placing of surface mounted devices SMD on a motherboard (PCB).

Attached to this specification are appendices A, B, C which from part of the specification.

Although this invention has been described in terms of certain preferred embodiments, other embodiments that are apparent to those of ordinary skill in the art are also within the scope of this invention. Accordingly, the scope of the invention is intended to be defined by the claims that follow.

What is claimed is:

1. An amplifier module suitable for automated mounting on a motherboard of a cellular phone, comprising:

a substrate, the substrate having an upper surface and a lower surface, and at least two layers of electrically conducting material;

a first semiconductor chip, said first chip comprising a first integrated circuit operating as part of a first power amplifier and being adapted for a first radio frequency band;

a second semiconductor chip, said second chip comprising a second integrated circuit operating as part of a second power amplifier and being adapted for a second radio frequency band; and said first and second chips being positioned on said upper surface of said substrate and electrically connected to components mounted on said upper surface to form two power amplifiers operable independently of each other.

2. The amplifier module of claim 1, wherein said substrate comprises four layers of electrically conducting material.

3. The amplifier module of claim 2, wherein one of said four layers covers said lower surface of said substrate, said layer covering said lower surface having a plurality of solder pads for soldering said power amplifier module to said motherboard.

4. The amplifier module of claim 3, wherein said layer covering said lower surface is shaped as a pair of circular areas, said areas comprising a plurality of solder pads.

5. The amplifier module of claim 2, wherein a first of said four layers forms said upper surface of said substrate, a fourth of said four layers forms said lower surface, and a second and third of said layers form intermediate layers on said substrate; said first layer comprising lines which are part of input circuits of said integrated circuits and said third layer comprising lines which are part of output circuits of said integrated circuits, and wherein said second layer assists in electrically insulating said input circuits from said output circuits.

6. The amplifier module of claim 1, wherein said substrate comprises thermal vias which extend from said upper surface to said lower surface, said vias being grouped into a first group and a second group.

7. The amplifier module of claim 6, wherein each one of said chips is positioned above one of said groups of thermal vias.

8. The amplifier module of claim 7, wherein each via has a wall which is covered with said electrically conducting material for conducting heat away from said chips.

9. The amplifier module of claim 1, wherein said electrically conducting material is copper.

10. The amplifier module of claim 1, wherein said first radio frequency band is about 900 MHz, and said second radio frequency band is about 1800 MHz.

11. The amplifier module of claim 1, wherein said first radio frequency band is about 900 MHz, and said second radio frequency band is about 1900 MHz.

12. A cellular phone for a mobile communications system, said cellular phone being operable at a first radio frequency band and a second radio frequency band comprising a motherboard, said motherboard having a signal processing module and a dual band power amplifier module serially interconnected between a microphone and an antenna, said dual band power amplifier module comprising:
   a substrate, the substrate having an upper surface and a lower surface, and at least two layers of electrically conducting material;
   a first semiconductor chip, said first chip comprising a first integrated circuit operating as part of a first power amplifier and being adapted for the first radio frequency band;
   a second semiconductor chip, said second chip comprising a second integrated circuit operating as part of a second power amplifier and being adapted for the second radio frequency band; and
   said first and second chips being positioned on said upper surface of said substrate and electrically connected to components mounted on said upper surface to form two power amplifiers operable independently of each other; and
   said signal processing module switching the dual power amplifier module to operate at one of said radio frequency bands.

13. The cellular phone of claim 12, wherein said substrate comprises four layers of electrically conducting material.

14. The cellular phone of claim 13, wherein said substrate comprises vias which extend from said upper surface to said lower surface, said vias being grouped into a first group and a second group.

15. The cellular phone of claim 14, wherein each one of said chips is positioned above one of said groups of vias.

16. The cellular phone of claim 15, wherein each via has a wall which is covered with said electrically conducting material for conducting generated heat away from said chips.

17. An amplifier module suitable for automated mounting on a mother board of a cellular phone, comprising:
   a substrate, said substrate having an upper surface and a lower surface, and at least two layers of electrically conducting material, said substrate comprises thermal vias which extend from said upper surface to said lower surface, at least of one of said thermal vias thermally connecting to one of said layers, said thermal vias being grouped into a first group and a second group;
   a first semiconductor chip, said first chip comprising a first integrated circuit operating as part of a first power amplifier and being adapted for a first radio frequency band;
   a second semiconductor chip, said second chip comprising a second integrated circuit operating as part of a second power amplifier and being adapted for a second radio frequency band; and
   said first and second chips being positioned on said upper surface of said substrate and electrically connected to components mounted on said upper surface.

18. The amplifier module of claim 17, wherein said substrate comprises four layers of electrically conducting material.

19. The amplifier module of claim 17, wherein each one of said chips is positioned above one of said groups of vias.

20. The amplifier module of claim 17, wherein each via has a wall which is covered with said electrically conducting material for conducting generated heat away from said chips.

21. A method for manufacturing a dual band power amplifier module for a dual band cellular phone, said method comprising the steps of:
   etching a substrate having multiple layers of electrically conducting material in accordance with a layout of an electrical circuit diagram;
   mounting passive electrical components to an upper surface of said substrate;
   mounting a first semiconductor chip to said upper surface, said first chip comprising a first integrated circuit operating as part of a first power amplifier and being adapted for a first radio frequency band;
   mounting a second semiconductor chip to said upper surface, said second chip comprising a second integrated circuit operating as part of a second power amplifier and being adapted for a second radio frequency band; and
   electrically connecting said first and second chips to said upper surface of said substrate to form two power amplifiers operable independently of each other on a single multiple layer substrate.

* * * * *